(12) United States Patent
     Toyama

(10) Patent No.: US 12,568,830 B2
(45) Date of Patent: Mar. 3, 2026

(54) SEMICONDUCTOR DEVICE WITH X-SHAPED DIE PAD TO REDUCE THERMAL STRESS AND ION MIGRATION FROM BONDING LAYER

(71) Applicant: ROHM CO., LTD., Kyoto (JP)

(72) Inventor: Tomoichiro Toyama, Kyoto (JP)

(73) Assignee: ROHM CO., LTD., Kyoyo (JP)

( * ) Notice: Subject to any disclaimer, the term of this patent is extended or adjusted under 35 U.S.C. 154(b) by 691 days.

(21) Appl. No.: 17/911,359

(22) PCT Filed: Feb. 24, 2021

(86) PCT No.: PCT/JP2021/006842
     § 371 (c)(1),
     (2) Date: Sep. 13, 2022

(87) PCT Pub. No.: WO2021/192788
     PCT Pub. Date: Sep. 30, 2021

(65) Prior Publication Data
     US 2023/0098414 A1    Mar. 30, 2023

(30) Foreign Application Priority Data
     Mar. 23, 2020    (JP) ................................. 2020-050705

(51) Int. Cl.
     *H01L 23/498*    (2006.01)
     *H01L 23/00*     (2006.01)
     *H01L 23/495*    (2006.01)
     *H10H 20/852*    (2025.01)
     *H10H 20/857*    (2025.01)
(52) U.S. Cl.
     CPC .. *H01L 23/49513* (2013.01); *H01L 23/49503* (2013.01); *H01L 24/29* (2013.01);
     (Continued)

(58) Field of Classification Search
     CPC ......... H01L 24/05; H01L 24/06; H01L 24/29; H01L 24/32; H01L 24/48; H01L 24/49;
     (Continued)

(56) References Cited

U.S. PATENT DOCUMENTS

| | | | | |
|---|---|---|---|---|
| 2010/0277919 | A1* | 11/2010 | Okada | H10H 20/857 257/E33.056 |
| 2018/0182945 | A1* | 6/2018 | Shimabukuro | H10H 29/10 |
| 2023/0098414 | A1* | 3/2023 | Toyama | H10H 20/852 257/99 |

FOREIGN PATENT DOCUMENTS

| | | | |
|---|---|---|---|
| JP | 9-162330 A | | 6/1997 |
| JP | H09162330 A | * | 6/1997 |

(Continued)

OTHER PUBLICATIONS

International Search Report issued in PCT/JP2021/006842, May 11, 2021 (2 pages).

(Continued)

*Primary Examiner* — Wael M Fahmy
*Assistant Examiner* — Aneesa Riaz Baig
(74) *Attorney, Agent, or Firm* — HSML P.C.

(57)                ABSTRACT

A semiconductor device includes: a supporting member having a wiring including a die-pad; a semiconductor element bonded to the die-pad; a wire bonded to the wiring and the semiconductor element; and a bonding layer that has a conductivity and bonds the die-pad and the semiconductor element. When viewed in a thickness direction of the semiconductor element, the die-pad includes a first region included inside a peripheral edge of the semiconductor element and a second region that is connected to the first region and extends farther then the peripheral edge of the semiconductor element. When viewed in the thickness direction, the wire is separated from the second region.

16 Claims, 12 Drawing Sheets

(52) U.S. Cl.
CPC .............. *H01L 24/32* (2013.01); *H01L 24/48*
(2013.01); *H01L 24/73* (2013.01); *H10H*
*20/852* (2025.01); *H10H 20/857* (2025.01);
*H01L 2224/2929* (2013.01); *H01L 2224/29339*
(2013.01); *H01L 2224/32225* (2013.01); *H01L*
*2224/48247* (2013.01); *H01L 2224/73265*
(2013.01)

(58) Field of Classification Search
CPC ..................... H01L 24/73; H01L 24/83; H01L
2224/49113; H01L 2224/83194; H01L
2224/48247; H01L 2224/48227; H01L
23/49503; H01L 23/49513
See application file for complete search history.

(56) References Cited

FOREIGN PATENT DOCUMENTS

| JP | 2006013347 A | * | 1/2006 |
|----|--------------|---|--------|
| JP | 2008-118071 A | | 5/2008 |
| JP | 2012-234955 A | | 11/2012 |
| JP | 2018-107207 A | | 7/2018 |
| WO | 2009/011302 A1 | | 1/2009 |

OTHER PUBLICATIONS

Office Action received in the corresponding Japanese Patent application, Feb. 6, 2024, and machine translation (8 pages).

* cited by examiner

SEMICONDUCTOR DEVICE WITH X-SHAPED DIE PAD TO REDUCE THERMAL STRESS AND ION MIGRATION FROM BONDING LAYER

TECHNICAL FIELD

The present disclosure relates to a semiconductor device.

BACKGROUND ART

Patent Document 1 discloses an example of a semiconductor device. In the semiconductor device, a semiconductor element (an LED chip) is bonded to a lead frame by a conductive die bonding material. Further, the semiconductor device is provided with two wires. While these wires are bonded to the lead frame, they are bonded to two terminals (an anode terminal and a cathode terminal) provided for the semiconductor element. As to each wire, a ball bonding part is bonded to the lead frame first, and thereafter a stitch bonding part is bonded to one of the above two terminals.

As for the conventional semiconductor device as above, the die bonding material is silver paste. It is supposed that, among the above two terminals, the anode terminal is on a lower surface of the semiconductor element, and the cathode terminal is on an upper surface of the semiconductor element. When this semiconductor device is used under a circumstance where there is moisture, a phenomenon called ion-migration Occurs. Specifically, when a voltage is applied to the above two terminals, the silver particles included in the silver paste are positively ionized (Ag+), and are attracted toward a cathode terminal side. As a result, silver is precipitated on a cathode terminal, a wire connected to the cathode terminal, and an n-type semiconductor layer and the like conducted to the cathode terminal. However, such precipitations of silver cause malfunctions such as a short-circuiting of a current path of the semiconductor device.

TECHNICAL REFERENCE

Patent Document

Patent Document 1: JP-A-2012-234955

SUMMARY OF THE INVENTION

Problems to be Solved by the Invention

In light of the above circumstance, an object of the present disclosure is to provide a semiconductor device that is capable of preventing an ion migration from the bonding layer used to bond a semiconductor element to a wiring.

Means for Solving the Problems

A semiconductor device according to a first aspect of the present disclosure includes: a supporting member having a wiring including a die-pad; a semiconductor element bonded to the die-pad; a wire bonded to the wiring and the semiconductor element; and a bonding layer that has a conductivity and bonds the die-pad and the semiconductor element. When viewed in a thickness direction of the semiconductor element, the die-pad includes a first region included inside a peripheral edge of the semiconductor element and a second region that is connected to the first region and extends farther then the peripheral edge of the semiconductor element. When viewed in the thickness direction, the wire is separated from the second region.

Preferably, the bonding layer includes a part located over the second region.

Preferably, the bonding layer is made of a material including metallic particles and a synthetic resin.

Preferably, the metallic particles are silver.

Preferably, the die-pad has a first band-like part extending in a direction orthogonal to the thickness direction, and a second band-like part and a third band-like part extending in a width direction of the first band-like part, the first band-like part having a first end and a second end separated from each other in the width direction. The second band-like part is connected to the first end of the first band-like part. The third band-like part is connected to the second end of the first band-like part. Each of the first band-like part, the second band-like part and the third band-like part includes the first region and the second region. A part of the first band-like part held between the second band-like part and the third band-like part is the first region.

Preferably, when viewed in the thickness direction, the semiconductor element is a rectangle having four corners. When viewed in the thickness direction, each of the four corners is overlapped with one of the first band-like part, the second band-like part and the third band-like part.

Preferably, when viewed in the thickness direction, the wire is overlapped with the first band-like part. When viewed in the thickness direction, a peripheral edge of the first band-like part includes a pad side intersecting with the wire, and a first extension line including the pad side intersects with the second band-like part. The first band-like part has a projection that is the second region located closest from the wire. When viewed in the thickness direction, a peripheral edge of the projection includes a part of the pad side.

Preferably, when viewed in the thickness direction, a peripheral edge of the semiconductor element includes a first rim intersecting with the wire and a second rim that is connected to the first rim and is located closest from the wire. When viewed in the thickness direction, the projection is located on a side to separate from the second band-like part with respect to a second extension line including the second rim.

Preferably, the pad side is parallel to the first rim.

Preferably, the semiconductor element has a first conductive layer opposed to the first region, and the second conductive layer positioned on an opposite side from the first conductive layer in the thickness direction. The first conductive layer is bonded to the die-pad via the bonding layer. The wire is bonded to the second conductive layer.

Preferably, the first conductive layer is made of a material including a semiconductor.

Preferably, the semiconductor element is an LED.

Preferably, the semiconductor device further includes a translucent resin in contact with the supporting member. The translucent resin covers the semiconductor element and the wire.

Preferably, the supporting member has a base material having a front surface facing in the thickness direction. The wiring in arranged on the front surface, and the translucent resin is in contact with the front surface.

Preferably, the base material has a bottom surface facing oppositely from the front surface in the thickness direction, and a lateral surface that is connected to the front surface and the bottom surface and faces in a direction orthogonal to the thickness direction outwardly, and a plurality of penetrating parts recessed from the lateral surface toward inside of the base material and connected to the front surface and the bottom surface. The supporting member has a plurality of terminals arranged on the bottom surface, and a plurality of lateral surface terminals individually arranged on the plurality of penetrating parts. Each of the plurality of lateral surface terminals is conducted to the wiring, and is connected to one of the plurality of terminals.

Preferably, the semiconductor device further includes a resist layer that is arranged on the front surface, and has electric insulating property. The resist layer blocks one end in the thickness direction of each of the plurality of penetrating parts.

Preferably, at least a part of the resist layer is located between the supporting member and the translucent resin.

A semiconductor device according to a second aspect of the present disclosure includes: a supporting member having a wiring including a die-pad; a semiconductor element bonded to the die-pad; a wire bonded to the wiring and the semiconductor element; a bonding layer having a conductivity and bonding the die-pad and the semiconductor element. When viewed in the thickness direction of the semiconductor element, the die-pad includes a first region included inside a peripheral edge of the semiconductor element, and a second region that is connected to the first region, and extends farther than the peripheral edge of the semiconductor element. The die-pad has a first band-like part extending in a direction orthogonal to the thickness direction, and a second band-like part and a third band-like part extending in a width direction of the first band-like part, the first band-like part having a first end and a second end separated from each other in the width direction. The second band-like part is connected to the first end of the first band-like part. The third band-like part is connected to the second end of the first band-like part. Each of the first band-like part, the second band-like part and the third band-like part includes the first region and the second region. A part of the first band-like part held between the second band-like part and the third band-like part is the first region. When viewed in the thickness direction, the wire is overlapped with the first band-like part. When viewed in the thickness direction, a peripheral edge of the first band-like part includes a pad side intersecting with the wire, and a first extension line including the pad side intersects with the second band-like part.

Preferably, when viewed in the thickness direction, a peripheral edge of the semiconductor element includes a first rim intersecting with the wire and a second rim that is connected to the first rim and is located closest from the wire. When viewed in the thickness direction, the first band-like part includes a first projection that is the second region and is overlapped with the wire, and a second projection that is the second region and is connected to the first projection. When viewed in the thickness direction, a second extension line including the second rim works as a border between the first projection and the second projection. When viewed in the thickness direction, an area of the first projection is smaller than an area of the second projection.

Advantages of the Invention

According to the semiconductor device of the present disclosure, the ion-migration from the bonding layer used to bond the semiconductor element to a wiring can be prevented.

The other features and advantages of the present disclosure will be apparent by the detailed explanations made below based on the accompanying drawings.

MODE FOR CARRYING OUT THE INVENTION

The embodiments of the present disclosure is explained with reference to the accompanying drawings.

Figure 1:
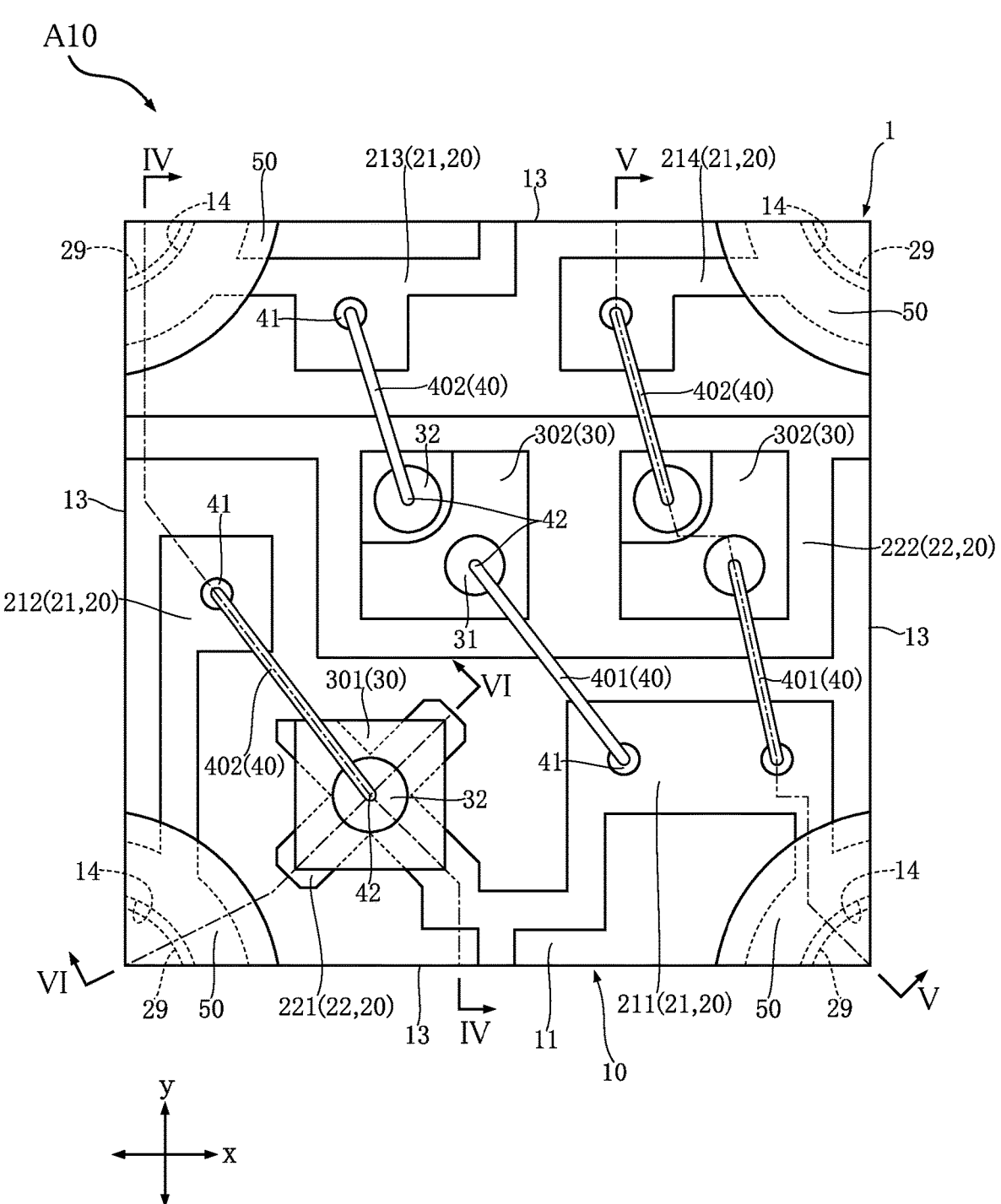
FIG. 1 is a plan view of the semiconductor device according to a first embodiment of the present disclosure, where a translucent resin is not shown as being transparent.

Based on FIGS. 1-8, a semiconductor device A10 according to a first embodiment of the present disclosure is explained. The semiconductor device A10 is provided with a supporting member 1, a plurality of semiconductor elements 30, a bonding layer 39, a plurality of wires 40, a resist layer 50 and a translucent resin 60. The semiconductor device A10 shown by these figures is a surface-mounting type semiconductor package where each of the plurality of semiconductor elements 30 is an LED (Light Emitting Diode). Here, in FIG. 1, the translucent resin 60 is not illustrated as being transparent, for ease of understanding. In FIG. 1, each of line IV-IV, line V-V, and line VI-VI is drawn by a dot-and-dash line.

Regarding the explanation of the semiconductor device A10, a thickness direction of each of the plurality of semiconductor elements 30 is referred to as a "thickness direction z". A direction orthogonal to the thickness direction z is referred to as a "first direction x". A direction orthogonal to both the thickness direction z and the first direction x is referred to as a "second direction y". As shown in FIG. 1, the semiconductor device A10 is rectangular when viewed in the thickness direction z. The first direction x is a horizontal direction of the semiconductor device A10 in FIG. 1. The second direction y is a vertical direction of the semiconductor device A10 in FIG. 1.

Figure 2:
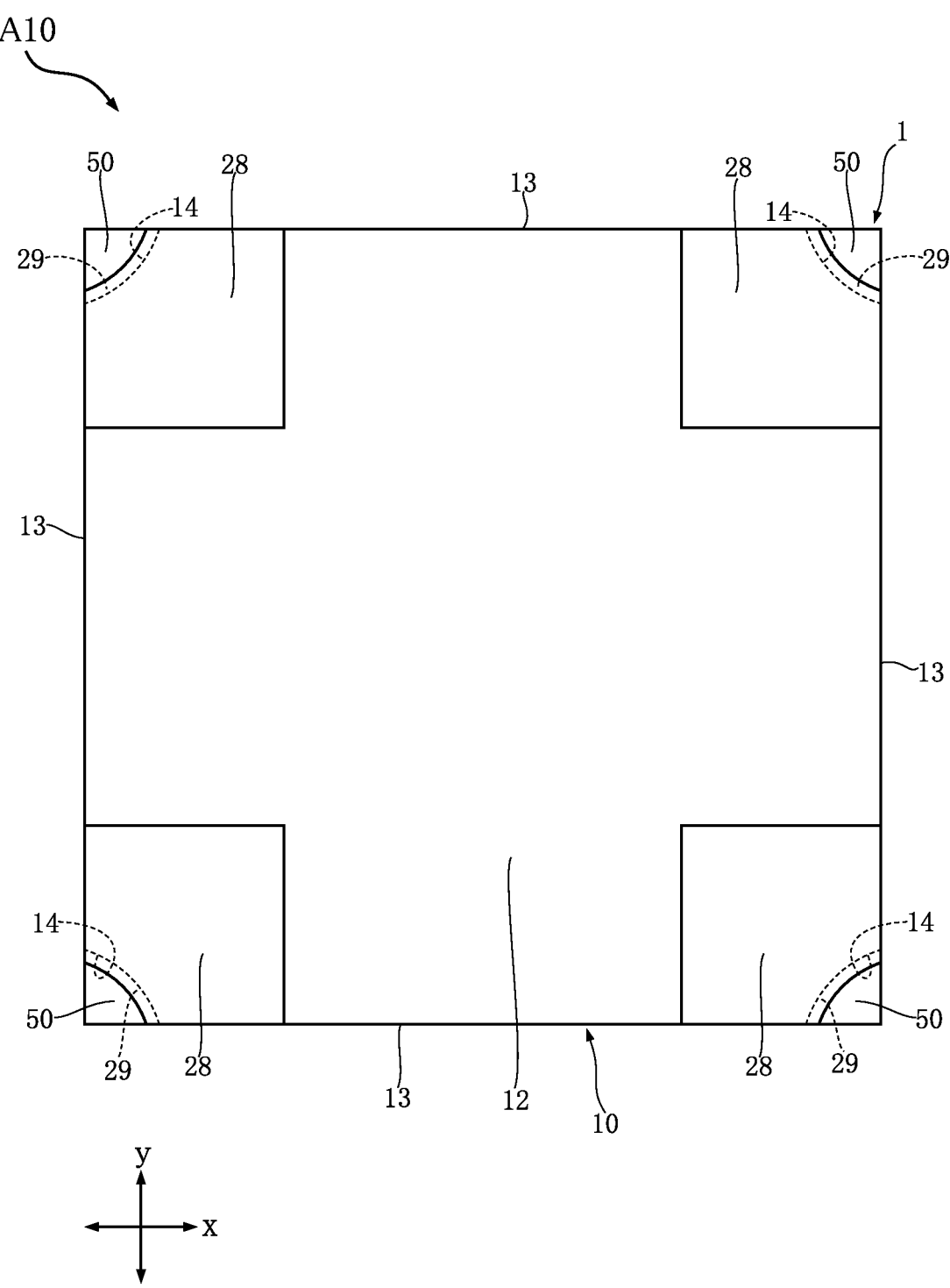
FIG. 2 is a bottom view of the semiconductor device of FIG. 1.
Figure 3:
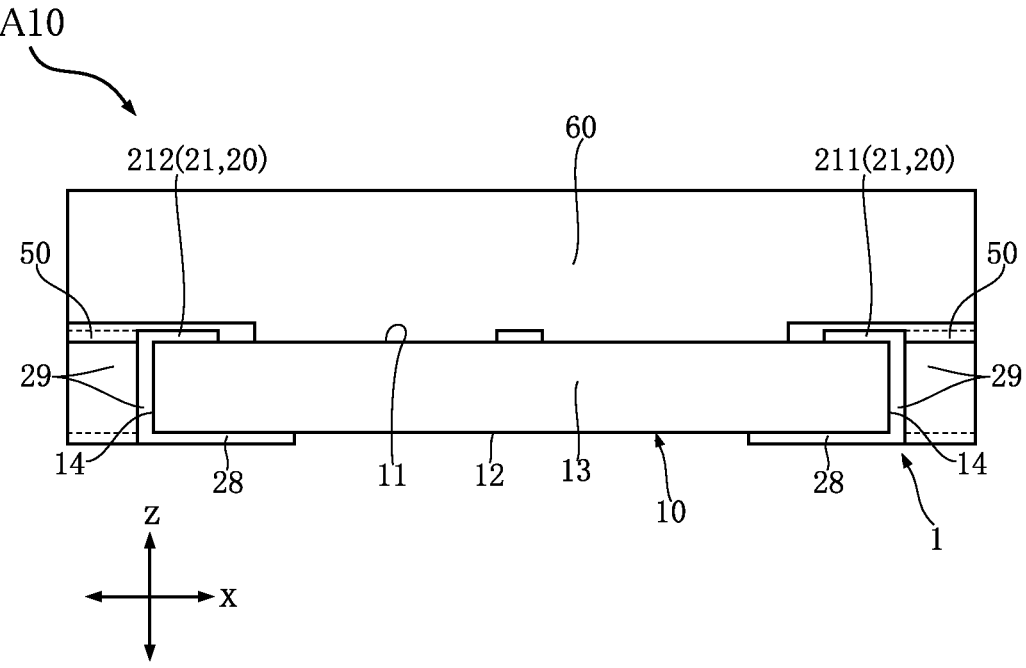
FIG. 3 is a front view of the semiconductor device of FIG. 1.
Figure 4:
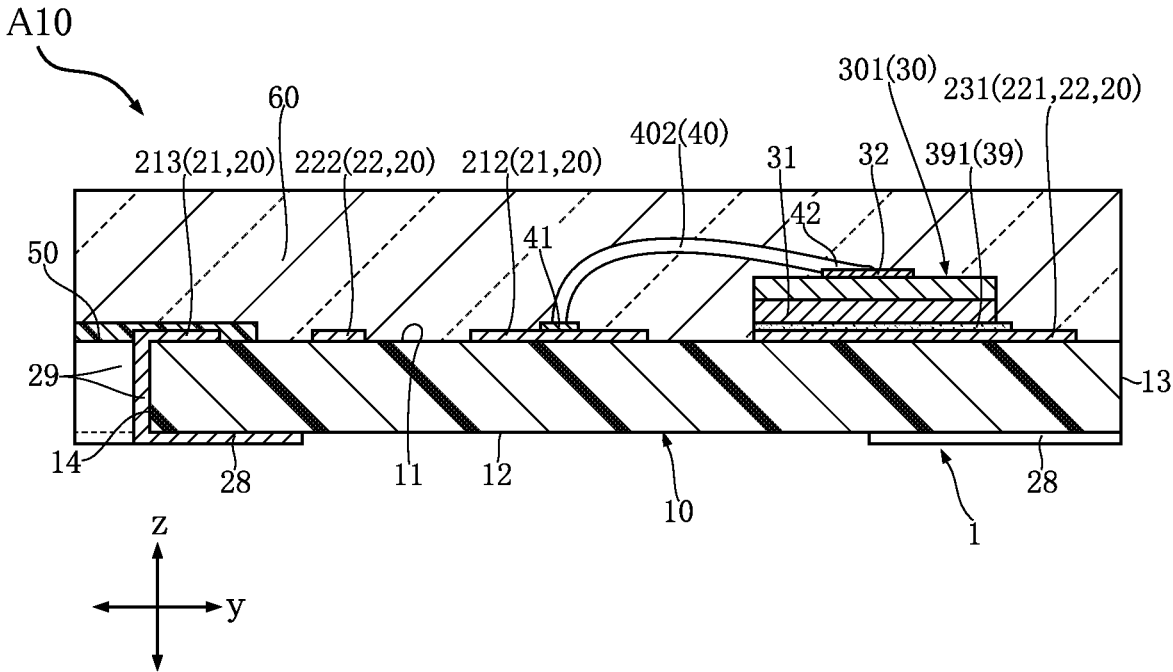
FIG. 4 is a cross sectional view taken along line IV-IV of FIG. 1.
Figure 5:
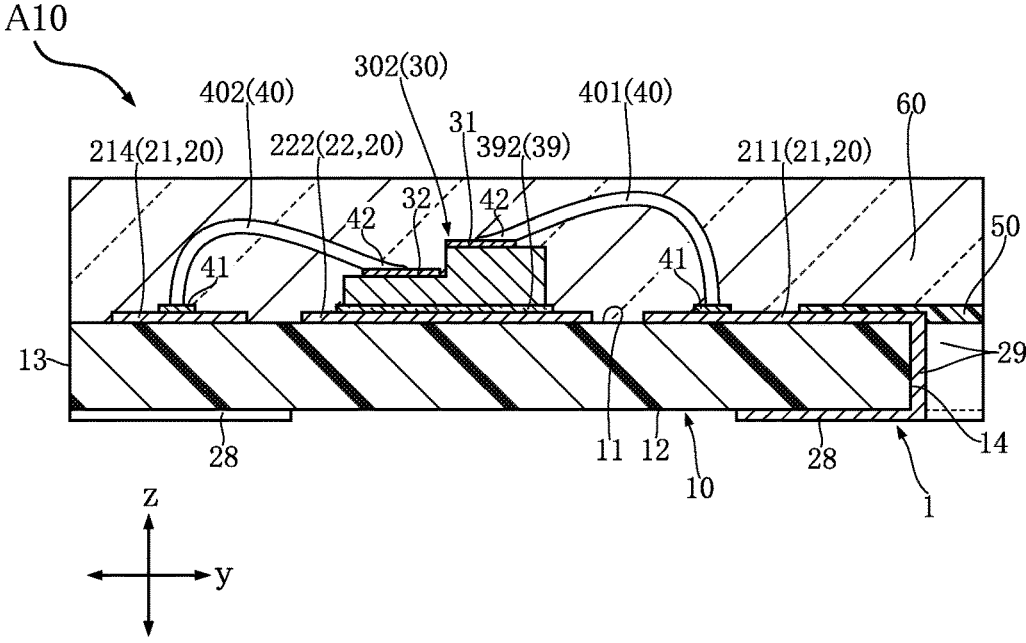
FIG. 5 is a cross sectional view taken along line V-V line of FIG. 1.

On the support member 1, as shown in FIGS. 1, 4 and 5, the plurality of semiconductor elements 30 are mounted on the supporting member 1. As shown in FIGS. 1 and 2, the supporting member 1 has a base material 10, a wiring 20, a plurality of terminals 28 and a plurality of lateral surface terminals 29, As shown in FIGS. 1, 2 and 4-6, on the base material 10, the wiring 20, the plurality of terminals 28 and the plurality of lateral surface terminals 29. The base material 10 has electric insulating property. The base material 10 is made of a material which include a glass epoxy resin, for example. The base material 10 has a front surface 11, a bottom surface 12, a lateral surface 13, and a plurality of penetrating parts 14. The front surface 11 and the bottom surface 12 face the opposite sides of the thickness direction z. Among these, the front surface 11 faces a side on which the plurality of semiconductor elements 30 are located of the thickness direction z. When the semiconductor device A10 is mounted on a wiring substrate, the bottom surface 12 is opposed to the wiring substrate. The lateral surface 13 is connected to the front surface 11 and the bottom surface 12, and faces outwardly in a direction orthogonal to the thickness direction z. On the semiconductor device A10, the lateral surface 13 includes a pair of regions facing in the first direction x outwardly and a pair of regions facing in the second direction y outwardly.

As shown in FIGS. 1-5, each of the plurality of penetrating parts 14 are recessed from the lateral surface 13 toward the inside of the base material 10, and are connected to the front surface 11 and the bottom surface 12. On the semiconductor device A10, each of the plurality of penetrating parts 14 is recessed from a boundary between one of the pair of regions of the lateral surface 13 facing in the first direction x outwardly and one of the pair of regions of the lateral surface 13 facing in the second direction y outwardly toward the inside of the base material 10. Thus, when viewed in the thickness direction z, each of the plurality of penetrating parts 14 are located in one of the four corners of the base material 10. Each of the plurality of penetrating parts 14 is fan-shaped when viewed in the thickness direction z.

As shown in FIGS. 1 and 4-6, the wiring 20 is arranged on the front surface 11 of the base material 10. On the semiconductor device A10, the wiring 20, together with the plurality of terminals 28 and the plurality of lateral surface terminals 29, forms a conductive path between the plurality of semiconductor elements 30 and the wiring substrate on which the semiconductor device A10 is mounted. On the semiconductor device A10, the wiring 20 is composed of a plurality of metallic layers. As an example of the plurality of metallic layers, a lamination of, starting from the side close to the front surface 11, a copper (Cu) layer, a nickel (Ni) layer and a gold (Au) layer can be mentioned. The wiring 20 is mainly formed by the electroplating. On the semiconductor device A10, the wiring 20 includes a plurality of pads 21 and a plurality of die-pads 22.

As shown in FIG. 1, one end of each of the plurality of pads 21 is in contact with a peripheral edge of the front surface 11 which defines one of the plurality of penetrating parts 14 of the base material 10. The plurality of pads 21 includes a first pad 211, a second pad 212, a third pad 213 and a fourth pad 214. The first pad 211 and the second pad 212 are adjacent to each other in the first direction x. The third pad 213 and the fourth pad 214 are adjacent to each other in the first direction x. Whereas, the plurality of die-pads 22 includes a first die-pad 221 and a second die-pad 222. The first die-pad 221 is connected to the first pad 211. The second pad 222 is between the first and second pads 211 and 212 and the third and fourth pads 213 and 214 in the second direction y. Therefore, the first and second pads 211 and 212 are located on one side in the second direction y with respect to the second die-pad 222. Also, the third and fourth pads 213 and 214 is located on the other side in the second direction y with respect to the second die-pad 222. Among the plurality of die-pads 22, a detailed configuration of the first die-pad 221 will be described later.

As shown in FIGS. 2 and 4-6, the plurality of terminals 28 are arranged on the bottom surface 12 of the base material 10. Each of the plurality of terminals 28 touches a peripheral edge of the bottom surface 12 which defines one of the penetrating parts 14 of the base material 10. When mounting the semiconductor device A10 on the wiring substrate, the plurality of terminals 28 are bonded to the wiring substrate via solder. On the semiconductor device A10, each of the plurality of terminals 28 is made of a plurality of metallic layers. The configuration of the plurality of metallic layers are the same with the configuration of the plurality metallic layers that constitute the wiring 20.

As shown in FIGS. 1, 2 and 4-6, the plurality of lateral surface terminals 29 are individually arranged on the plurality of penetrating part 14 of the base material 10. Each of the plurality of lateral surface terminals 29 is formed along one region of the lateral surface 13 of the base material 10 that defines each of the plurality of penetrating parts 14. At each of the plurality of lateral surface terminals 29, one end of the thickness direction z is connected to one of the plurality of pads 21. Further, the other end of the thickness direction z is connected to one of the plurality of terminals 28. Thus, each of the plurality of terminals 28 is conducted to one of the plurality of pads 21.

Figure 6:
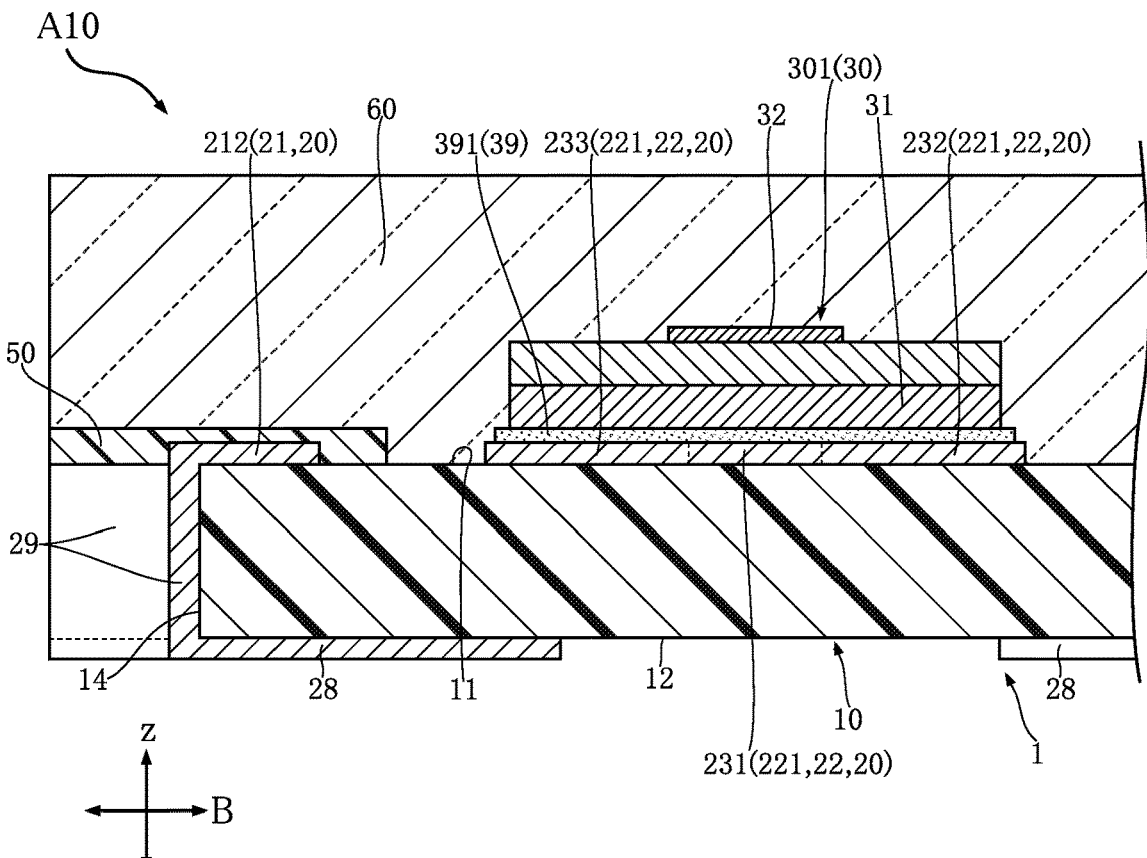
FIG. 6 is a cross sectional view taken along line VI-VI line of FIG. 1.

Each of the plurality of semiconductor elements 30 is, as shown in FIGS. 4-6, connected to one of the plurality of die-pads 22 by the die-bonding using the bonding layer 39. As shown in FIG. 1, on the semiconductor device A10, the plurality of semiconductor elements 30 include a first element 301 and two second elements 302. The first element 301 is connected to the first die-pad 221 among the plurality of die-pads 22. The first element 301 is an LED that emits red light. The two second elements 302 is bonded to the second die-pad 222 among the plurality of die-pads 22. Among the two second elements 302, one second element 302 is an LED that emits blue light. Further, the other second element 302 is an LED that emits green light.

As shown in FIGS. 4 and 5, on the semiconductor device A10, the bonding layer 39 includes a first bonding layer 391 and a second bonding layer 392. The first bonding layer 391 has a conductivity. The first conductive layer 391 is made of material including metallic particles and a synthetic resin. The metallic particles are silver (Ag). The synthetic resin is an epoxy resin, for example. The second bonding layer 392 has electric insulating property. The second bonding layer 392 is made of a material including poly-imide, for example. The first bonding layer 391 bonds the first die-pad 221 and the first element 301. The second bonding layer 392 bonds the second die-pad 222 and the two second elements 302.

Figure 8:
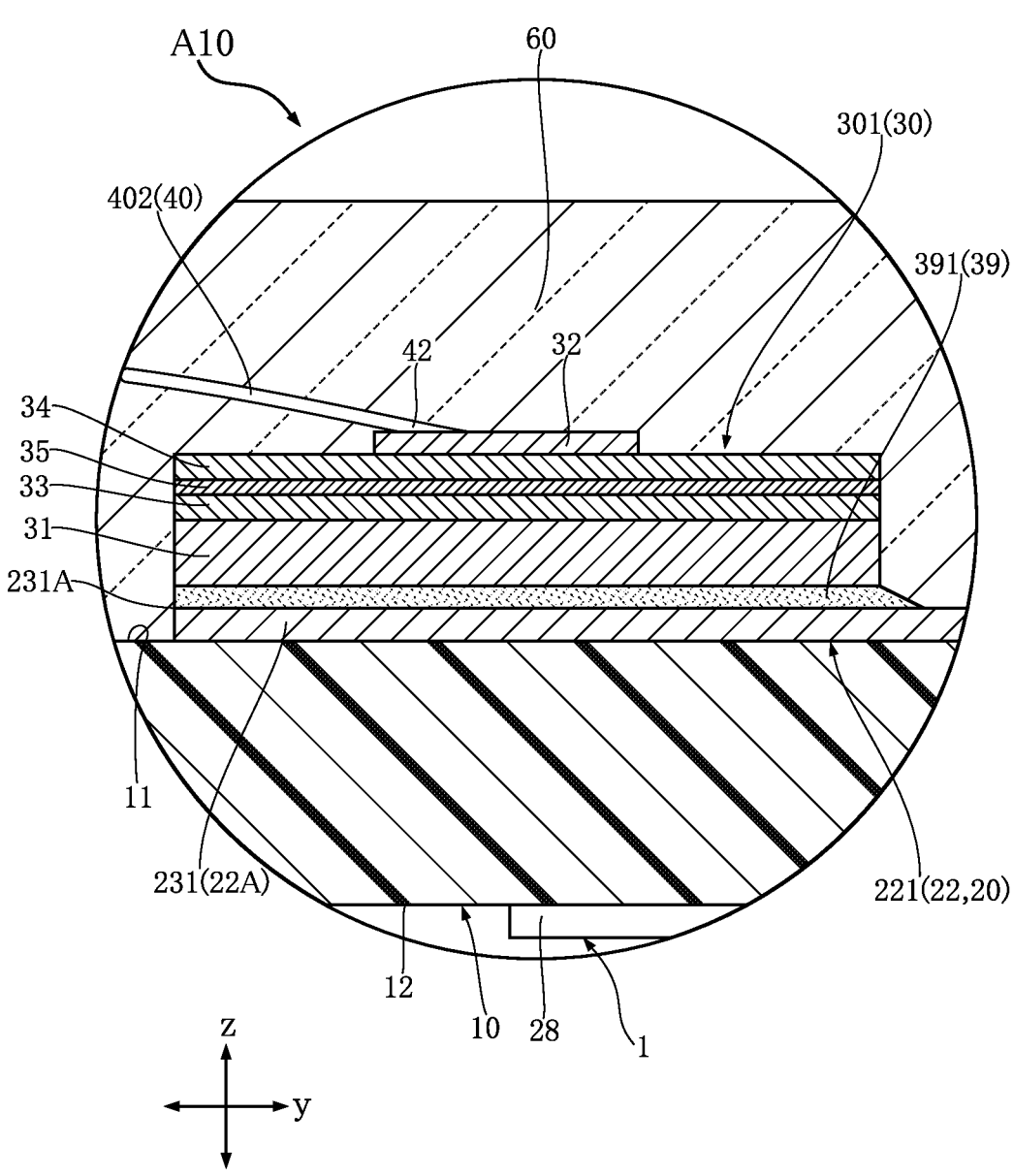
FIG. 8 is an enlarged view showing a part of FIG. 4.

As shown in FIG. 8, the first element 301 has a first conductive layer 31, a second conductive layer 32, a p-type semiconductor layer 33, a n-type semiconductor layer 34 and an active layer 35. Among these, the active layer 35 sandwiched by the p-type semiconductor layer 33 and the n-type semiconductor layer 34 in the thickness direction z is a luminous region of the first element 301. The first conductive layer 31 is opposed to a first region 22A of the first die-pad 221 (the details will be described later). The first conductive layer 31 is made of a material including a semiconductor material. The semiconductor material is silicon (Si) including p-type dopants. The first conductive layer 31 is an anode of the first element 301, and is in contact with the p-type semiconductor layer 33. The first conductive layer 31 is bonded to the first die-pad 221 via the first bonding layer 391. Thus, the first conductive layer 31 of the first element 301 is conducted to the first pad 211 among the plurality of pads 21. The second conductive layer 32 is located on a side opposite from the first conductive layer 31 in the thickness direction z. The second conductive layer 32 is a cathode of the second element 302, and is in contact with the n-type semiconductor layer 34. The second conductive layer 32 is made of a material including gold, for example. Each of the p-type semiconductor layer 33 and the n-type semiconductor layer 34 is made of a material including gallium arsenide (GaAs), for example. The active layer 35 is made of a material including aluminum gallium arsenide (AlGaAs), for example.

The structural form of the first element 301 is of the laminated type. First off, for manufacturing the first element 301, with respect to the gallium arsenide base material, the p-type semiconductor layer 33, the active layer 35, the n-type semiconductor layer 34 are formed in this order by the epitaxial growth. Next, from the gallium arsenide base material, the p-type semiconductor layer 33, the active layer 35, the n-type semiconductor layer 34 that are laminated are integrally peeled off. Next, the p-type semiconductor layer 33, the active layer 35, the n-type semiconductor layer 34 that are integrally laminated are attached to a silicon base material including p-type dopants (a silicon wafer). This time, the p-type semiconductor layer 33 should contact the silicon base material. The silicon base material corresponds to the first conductive layer 31. Next, the second conductive layer 32 in contact with the n-type semiconductor layer 34 is formed. Lastly, the silicon base material, the p-type semiconductor layer 33, the active layer 35, the n-type semiconductor layer 34 are integrally individualized, to have the first element 301.

As shown in FIGS. 1 and 5, each of the two second elements 302 has the first conductive layer 31 and the second conductive layer 32. Each of the first conductive layer 31 and the second conductive layer 32 is provided on an upper surface of the second element 302. Each of the first conductive layer 31 and the second conductive layer 32 is made of a material including gold, for example. The first conductive layer 31 is an anode of the second element 302. The second conductive layer 32 is a cathode of the second element 302. At each of the two second elements 302, the second conductive layer 32 is between the second die-pad 222 and the first conductive layer 31 in the thickness direction z.

Each of the plurality of wires 40 is bonded to one of the plurality of pads 21 at its one end as shown in FIG. 1, and the other end is bonded to one of the plurality of semiconductor elements 30. Each of the plurality of wires 40 is made of gold, for example. Each of the plurality of wires 40 is formed by the wire bonding. Each of the plurality of wires 40 has a first bonding part 41 and a second bonding part 42. The first bonding part 41 is one end of a wire 40, and is bonded to one of the plurality of pads 21. The first bonding part 41 is what is called a ball bonding part, and a formation starting part of the wire 40. The second bonding part 42 is the other end of the wire 40, and is bonded to one of the plurality of semiconductor elements 30. The second bonding part 42 is what is called a stitch bonding part, and is a formation ending part of the wire 40. According to the present configuration, the distance between the front surface 11 of the base material 10 and a top of each of the plurality of wires 40 can be minimized, and thus the dimension of the thickness direction z of the semiconductor device A10 can be downsized. On the semiconductor device A10, the plurality of wires 40 includes two first wires 401 and three second wires 402.

As shown in FIG. 1, the first bonding parts 41 of the two first wires 401 are bonded to the first pad 211 among the plurality of pads 21. Further, the second bonding parts 42 of the two first wires 401 are individually bonded to the first conductive layers 31 of the two second elements 302. Thus, the respective first bonding parts 31 of the two second elements 302 are conducted to the first pad 211. As explained above, the first conductive layer 31 of the first element 301 is conducted to the first pad 211. Therefore, on the semiconductor device A10, the plurality of semiconductor elements 30 are connected to the first pad 211 in parallel.

As shown in FIG. 1, the first bonding parts 41 of the three second wires 402 are individually bonded to the second pad 212, the third pad 213 and the fourth pad 214 among the plurality of pads 21. The second bonding pads 42 of the three second wires 402 are individually bonded to the second conductive layers 32 of the plurality of semiconductor elements 30. Thus, the second conductive layer 32 of the first element 301 is conducted to the second pad 212. Among the two second elements 302, the second conductive layer 32 of one of the second elements 302 is conducted to the third pad 213. Further, the second conductive layer 32 of the other of the second elements 302 is conducted to the fourth pad 214.

The resist layer 50 is, as shown in FIGS. 1 and 4-6, arranged on the front surface 11 of the base material 10. The resist layer 50 has electric insulating property. The resist layer 50 is a solder resist film, for example. On the semiconductor device A10, the resist layer 50 includes four regions. The four regions are arranged on the four corners of the front surface 11. Each of the four regions blocks one end in the thickness direction z of one of the plurality of penetrating parts 14 of the base material 10. Further, each of the four regions cover one of the plurality of pads 21 partially. As shown in FIGS. 3-6, at least a part of the resist layer 50 is located between the supporting member 1 and the translucent resin 60.

The translucent resin 60 is in contact with the supporting member 1 as shown in FIGS. 3-6. The translucent resin 60 covers a part of the plurality of pads 21, the plurality of wires 40 and the plurality of semiconductor elements 30. The translucent resin 60 transmits lights emitted from the plurality of semiconductor elements 30. The translucent resin 60 is made of a material including epoxy resin that includes silicon, for example.

Subsequently, a relationship between the first pad 211 among the plurality of die-pads 22, the first element 301 whose first conductive layer 31 is bonded to the first pad 211 by the first bonding layer 391, and the second wire 402 bonded to the second conductive layer 32 of the semiconductor element 30 is explained.

Figure 7:
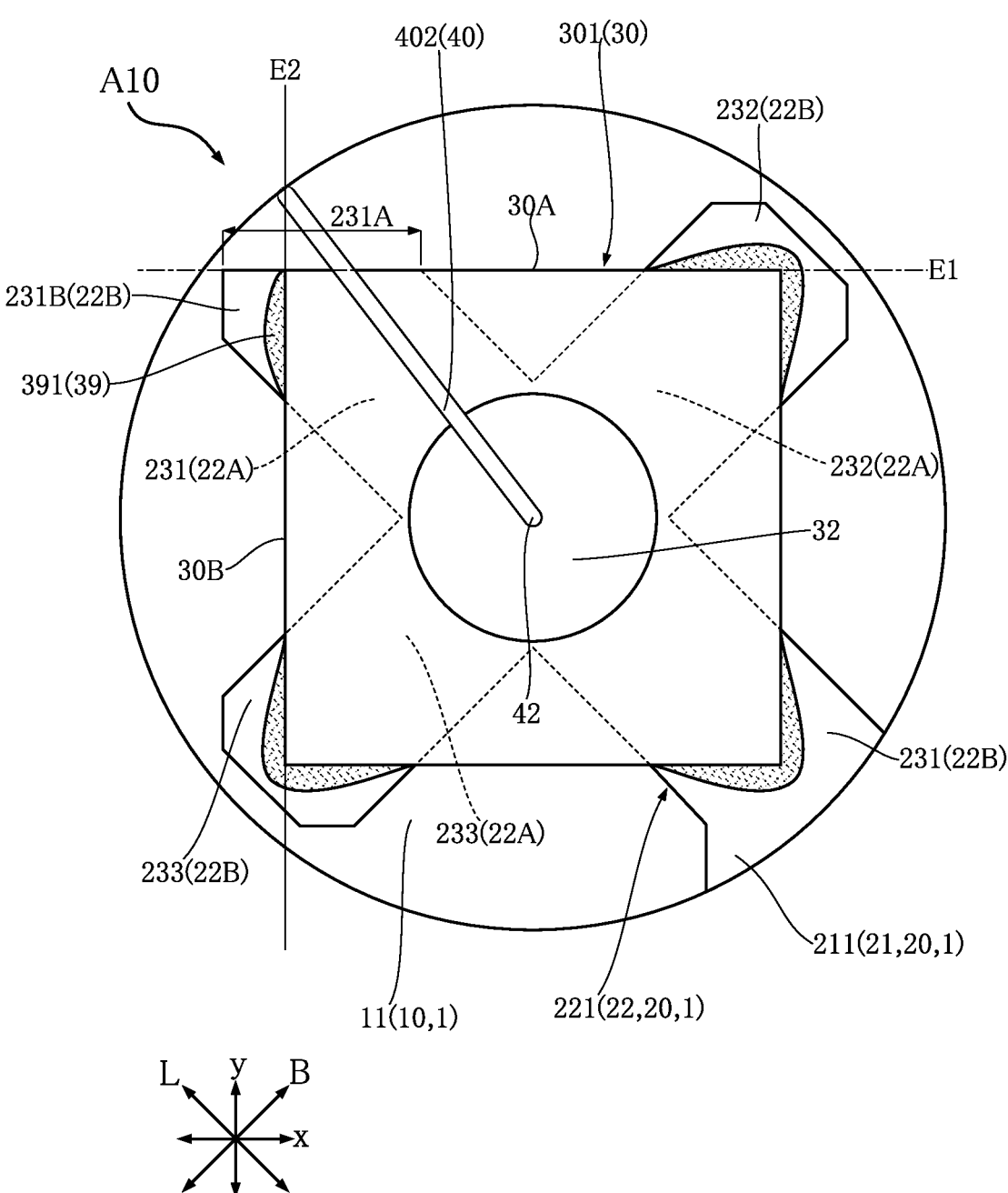
FIG. 7 is an enlarged view showing a part of FIG. 1.

As shown in FIG. 7, the first pad 211 includes the first region 22A and the second region 22B. When viewed in the thickness direction z, the first region 22A is included inside the peripheral edge of the first element 301. When viewed in the thickness direction z, the second region 22B is connected to the first region 22A, and extends farther than the peripheral edge of the first element 301. When viewed in the thickness direction z, the second wire 402 is separated from the second region 22B. On the semiconductor device A10, the first bonding layer 391 includes a part located over the second region 22B.

As shown in FIG. 7, the first pad 211 has a first band-like part 231, a second band-like part 232 and a third band-like part 233. The first band-like part 231 extends in a direction orthogonal to the thickness direction z. Here, in the explanations of the first pad 211 as below, the direction in which the first band-like part 231 extends is referred to as a "length direction of the first band-like part 231 (below, referred to as the "length direction L")". The direction along the width of the first band-like part 231 is referred to as a "width direction B of the first band-like part 231 (below, referred to as the "width direction B")". Each of the length direction L and the width direction B is orthogonal to the thickness direction z. Further, the width direction B is orthogonal to the length direction L, as well. One end of the first band-like part 231 in the length direction L is connected to the first pad 211 of the plurality of pads 21. Each of the second band-like part 232 and the third band-like part 233 extends in the width direction B. The second band-like part 232 is connected to one end of the first band-like part 231 in the width direction B. The third band-like part 233 is connected to the other end of the first band-like part 231 in the thickness direction B. Thus, when viewed in the thickness direction z, the first pad 211 has a shape of letter X.

Each of the first band-like part 231, the second band-like part 232 and the third band-like part 233 includes the first region 22A and the second region 22B. As shown in FIG. 7, a part of the first band-like part 231 held between the second band-like part 232 and the third band-like part 233 is a first region 22A.

As shown in FIG. 7, when viewed in the thickness direction z, the first element 301 has a rectangular shape having four corners. When viewed in the thickness direction z, each of the four corners is overlapped with one of the first band-like part 231, the second band-like part 232 and the third band-like part 233.

As shown in FIG. 7, when viewed in the thickness direction z, the second wire 402 is overlapped with the first band-like part 231. When viewed in the thickness direction z, the peripheral edge of the first region 22A of the first band-like part 231 includes a pad side 231A. When viewed in the thickness direction z, the pad side 231A intersects with the second wire 402, and a first extension line E1 including the pad line 231A shown in FIG. 7 intersects with the second band-like region 232. Further, the first band-like part 231 has a projection 231B. The projection 231B is the second region 22B that is closest from the second wire 402. When viewed in the thickness direction z, the peripheral edge of the projection 231B includes a part of the pad side 231A.

As shown in FIG. 7, when viewed in the thickness direction z, the peripheral edge of the first element 301 includes a first rim 30A and a second rim 30B. When viewed in the thickness direction z, the first rim 30A intersects with the second wire 402. The second rim 30B is connected to the first rim 30A, and is closest from the second wire 402. On the semiconductor device A10, the first rim 30A is along the first direction x, and the second rim 30B is along the second direction y. The pad side 231A of the first band-like part 231 is in parallel with the first rim 30A. When viewed in the thickness direction z, the second band-like part 232 extends farther than the pad side 231A in a direction along the second rim 30B, that is, in the second direction y. When viewed in the thickness direction z, the projection 231B is, with respect to a second extension line E2 including the second rim 30B as shown in FIG. 7, on a side separating from the second band-like part 232, and extends on a side separating from the wire 40 more than the first extension line E1 including the pad side 231A shown in FIG. 7 does.

Subsequently, a semiconductor device A11 and a semiconductor device A12 as variation examples of the semiconductor device A10 are explained. The semiconductor device A11 and the semiconductor device A12 are different from the semiconductor device A10 explained above, regarding the configuration of the first die-pad 221, among the plurality of die-pads 22.

Figure 9:
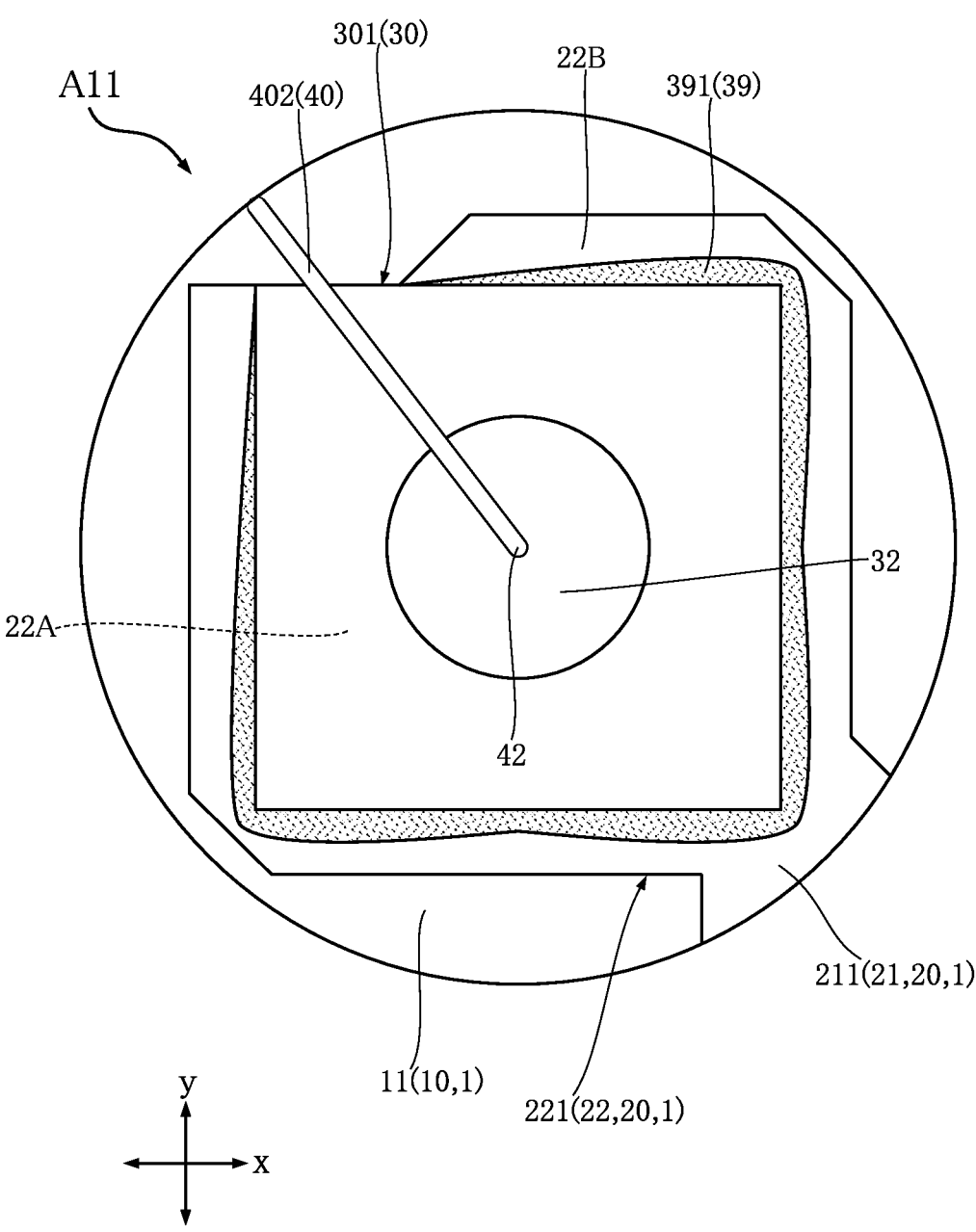
FIG. 9 is an enlarged plan view showing a part of a first variation of the semiconductor device according to a first embedment of the present disclosure, where a translucent resin is not shown as being transparent.
Figure 10:
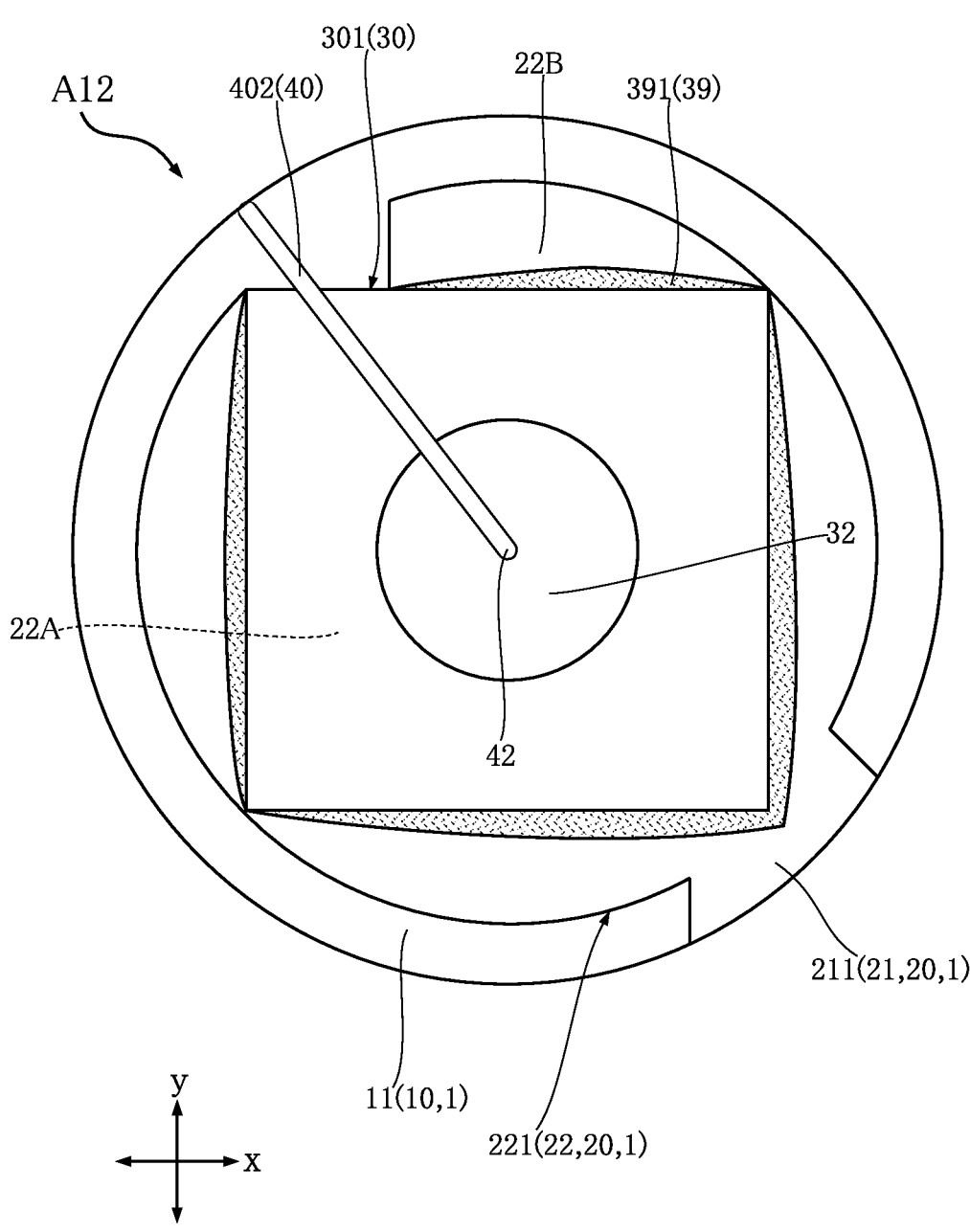
FIG. 10 is an enlarged plan view showing a part of a second variation of the semiconductor device according to a first embedment of the present disclosure, where a translucent resin is not shown as being transparent.

As shown in FIG. 9, when viewed in the thickness direction z, the peripheral edge of the first die-pad 221 of the semiconductor device A11 has a substantially rectangular shape that misses a part. Further, as shown in FIG. 10, when viewed in the thickness direction z, the peripheral edge of the first die-pad 221 of the semiconductor device A12 has a substantially circular shape that misses a part. When viewed in the thickness direction z, the second wire 402 intersects the region where the first die-pad 221 is partially missing.

Subsequently, the action and effect of the semiconductor device A10 are explained.

The semiconductor device A10 has a conductivity, and is provided with the bonding layer 39 (the first bonding layer 391) that bonds the die-pad 22 (the first die-pad 221) and the semiconductor element 30 (the first element 301). When viewed in the thickness direction z, the die-pad 22 (the first die-pad 221) included in the wiring 20 includes the first region 22A encompassed by the peripheral edge of the semiconductor element 30 (the first element 301) and the second region 22B that is connected to the first region 22A but extends farther than the peripheral edge of the semiconductor element 30. When viewed in the thickness direction z, the wire 40 (the second wire 402) is separated from the second region 22B. Thus, a part of the bonding layer 39 located over the second region 22B is separated from the wire 40, and thus the precipitation of the metallic particles on the wire 40 due to the ion migration from the bonding layer 39 can be prevented.

The die-pad 22 has the first band-like part 231 that extends in a direction orthogonal to the thickness direction z, the second band-like part 232 and the third band-like part 233 that extend in the width direction B of the first band-like part 231. The second band-like part 232 is connected to one end of the first band-like part 231 in the width direction B. The third band-like part 233 is connected to the other end of the first band-like part 231 in the width direction B. A part of the first band-like part 231 held between the second band-like part 232 and the third band-like part 233 is the first region 22A. Thus, when viewed in the thickness direction z, the die-pad 22 has a shape of letter x. Further, when viewed in the thickness direction z, the center of the die-pad 22 is overlapped with the semiconductor element 30.

Further, when viewed in the thickness direction z, each of the four corners of the semiconductor element 30 is overlapped with one of the first band-like part 231, the second band-like part 232 and the third band-like part 233. Thus, an excessive contraction of the bonding area of the semiconductor element 30 with respect to the die-pad 22 can be avoided, and a bonding strength of the semiconductor element 30 with respect to the die-pad 22 and a current that runs from the die-pad 22 to the semiconductor element 30 can be secured. Further, while the semiconductor device A10 is used, the semiconductor element 30 generates heat. The thermal stress caused by this heat diverges on the four corners. Thus, according to the present configuration, the bonding layer 39 sticks to the four corners, and the heat is more easily propagated to the die-pad 22 from the four corners. Thus, the diversion of the thermal stress toward the four corners can be reduced.

When viewed in the thickness direction z, the wire 40 is overlapped with the first band-like part 231. Thus, the second band-like part 232 extends from the first band-like part 231 in a direction to separate from the wire 40 gradually. When viewed in the thickness direction z, the peripheral edge of the first band-like part 231 includes the pad side 231A that intersects with the wire 40. The first extension line E1 (see FIG. 7) including the pad side 231A intersects with the second band-like part 232. When viewed in the thickness direction z, the band-like part 232 protrude beyond the pad side 231A in the direction along the second rim 30B of the semiconductor element 30 (in the second direction y). Thus, it can be configured that a part of the bonding layer 39 located over a region 22B of the second band-like part 232 is more separated from the wire 40.

The first band-like part 231 has a projection 231B that is the second region 22B located closest from the wire 40. When viewed in the thickness direction z, the projection 231B is on a side to separate from the second band-like part 232 with respect to the second extension line E2 (see FIG. 7) including the second rim 30B of the semiconductor element 30. Thus, the projection 231B is set on a location more distant from the wire 40, and a part of the bonding layer 39 closest from the wire 40 can be more separated from the wire 40. Further, when viewed in the thickness direction z, the projection 231B does not extend farther the first extension line E1 including the pad side 231A to approach the wire 40. Thus, the projection 231B is set to be more distant from the wire 40, and a part of the bonding layer 39 located closest from the wire 40 can be further separated from the wire 40.

The supporting member 1 has a base material 10. The base material 10 has a plurality of penetrating parts 14 recessed from the lateral surface 13 toward the inside of the base material 10, and are connected to the front surface 11 and the bottom surface 12. The supporting member 1 further has the plurality of terminals 28 arranged on the bottom surface 12, and the plurality of lateral surface terminals 29 individually arranged on the plurality of penetrating parts 14. Each of the plurality of lateral surface terminals 29 is conducted to the wiring 20, and is connected to one of the plurality of terminals 28. Thus, when mounting the semiconductor device A10 on the wiring substrate, solder is attached on the plurality of lateral surface terminals 29 in addition to the plurality of terminals 28. Therefore, the mounting strength of the semiconductor device A10 with respect to the wiring substrate improves. Further, by visually inspecting the shape of the solder attached to the plurality of lateral surface terminals 29, the mounting status of the semiconductor device A10 mounted on the wiring substrate can be easily checked.

The semiconductor device A10 is further provided with the translucent resin 60 that is in contact with the supporting member 1 and covers the semiconductor element 30 and the wire 40, and the resist layer 50 that is arranged on the front surface 11 of the base material 10 and has electric insulating property. The resist layer 50 blocks one end of each of the plurality of penetrating parts 14 of the base material 10 in the thickness direction. Further, at least a part of the resist layer 50 is located between the supporting member 1 and the translucent resin 60. Therefore, while manufacturing the semiconductor device A10, a leakage of the translucent resin 60 in a fluid state toward the plurality of penetrating parts 14 can be prevented.

Further, with respect to the variation examples such as the semiconductor device A11 shown in FIG. 9 and the semiconductor device A12 shown in FIG. 10, the action and effect can be exhibited as in the case of the semiconductor device A10.

Figure 11:
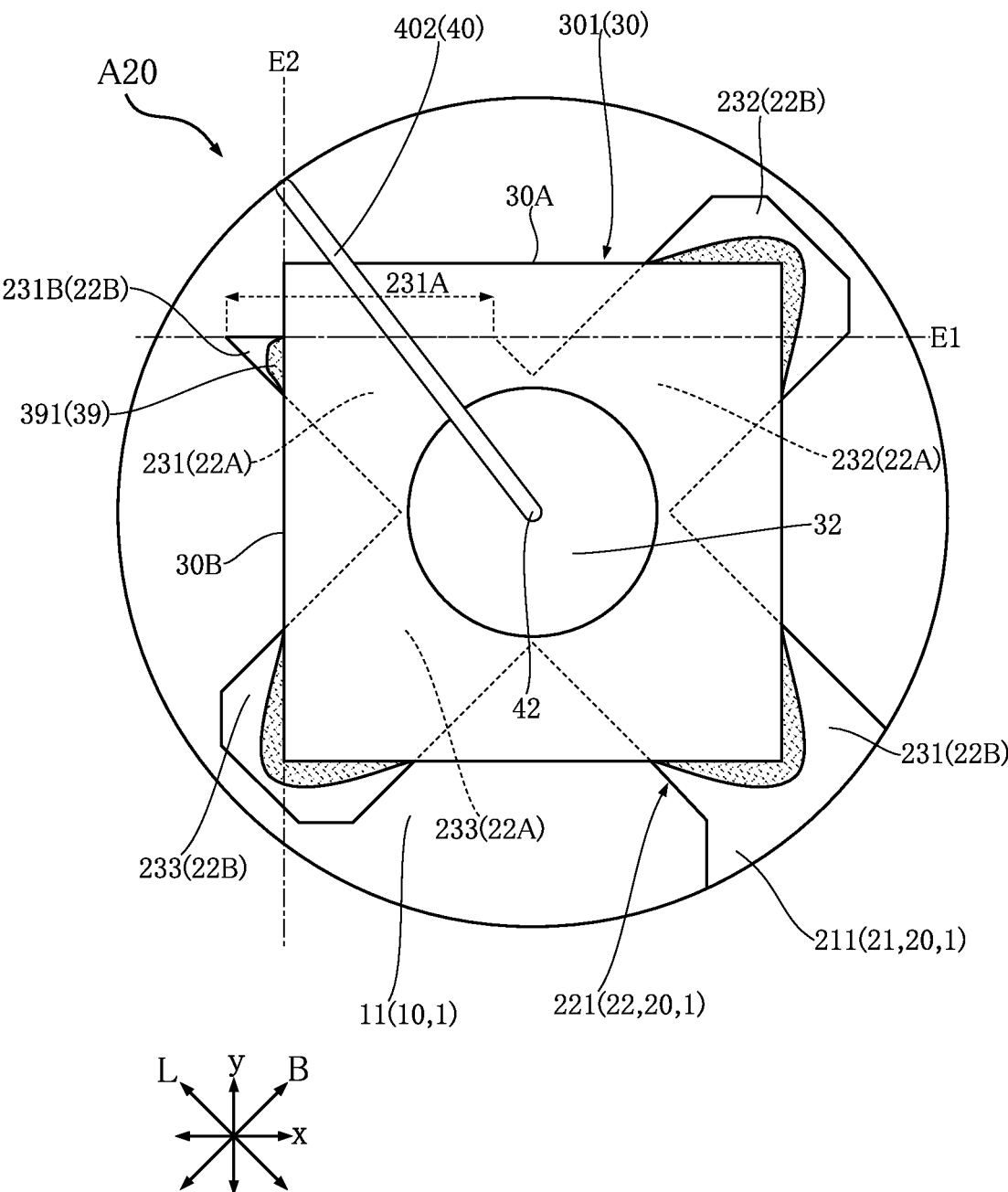
FIG. 11 is an enlarged plan view showing a part of the semiconductor device according to a second embedment of the present disclosure, where a translucent resin is not shown as being transparent.
Figure 12:
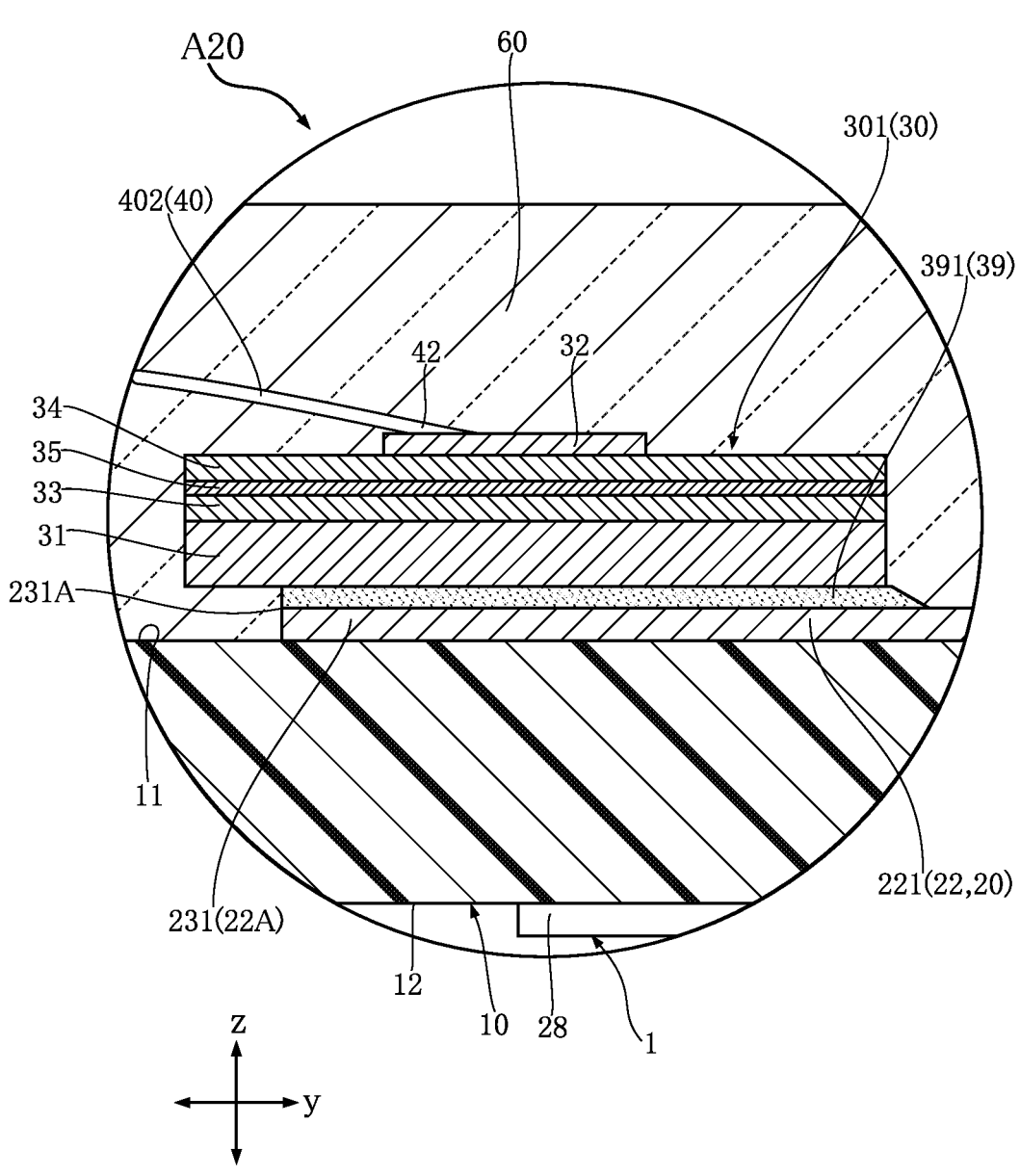
FIG. 12 is an enlarged plan view showing a part of the semiconductor device shown in FIG. 11.

Based on FIGS. 11 and 12, a semiconductor device A20 according to a second embodiment of the present disclosure is explained. In these figures, the same reference numerals are given to the elements identical to or similar with those of the semiconductor device A10 that have already been explained, and the redundant explanations are omitted. In FIG. 11, the translucent resin 60 is regarded as transparent for ease of understanding. The range covered by FIG. 11 is the same as the range covered by FIG. 7. The position and the size of the section shown by FIG. 12 are the same with the position and the size of the section shown by FIG. 8.

On the semiconductor device A20, the configuration of the first die-pad 221 among the die-pads 22 is different from that of the semiconductor device A10 explained already.

As shown in FIG. 11, regarding the first die-pad 221 of the semiconductor device A20, when viewed in the thickness direction z, the pad side 231A of the first band-like part 231 is separated from the first rim 30A of the first element 301. When viewed in the thickness direction z, with respect to the first extension line E1 including the pad side 231A shown in FIG. 11, the pad side 231A is on a side to get close to the third band-like part 233. Thus, when viewed in the thickness direction z, the pad side 231A includes a section located inside the peripheral edge of the first element 301. Therefore, when viewed in the thickness direction z, a part of the translucent resin 60 gets into a region held between the pad side 231A and the first rim 30A and held between the base material 10 and the first element 301 in the thickness direction z (see FIG. 12). Further, when viewed in the thickness direction z, the area of the projection 231B of the first band-like part 231 is smaller than the area of the semiconductor device A10 explained already.

Subsequently, the action and effect of the semiconductor device A20 are explained.

The semiconductor device A20 has a conductivity, and is provided with the bonding layer 39 (the first bonding layer 391) bonding the die-pad 22 (the first die-pad 221) and the semiconductor element 30 (the first element 301). When viewed in the thickness direction z, the die-pad 22 (the first die-pad 221) included in the wiring 20 includes the first region 22A included inside the peripheral edge of the semiconductor element 30 (the first element 301) and the second region 22B that is connected to the first region 22A and extending farther than the peripheral edge of the semiconductor element 30. When viewed in the thickness direction z, the wire 40 (the second wire 402) is separated from the second region 22B. Therefore, according to the semiconductor device A20 as well, the ion migration from the bonding layer 39 used to bond the semiconductor 30 to the wiring 20 can be prevented.

Figure 13:
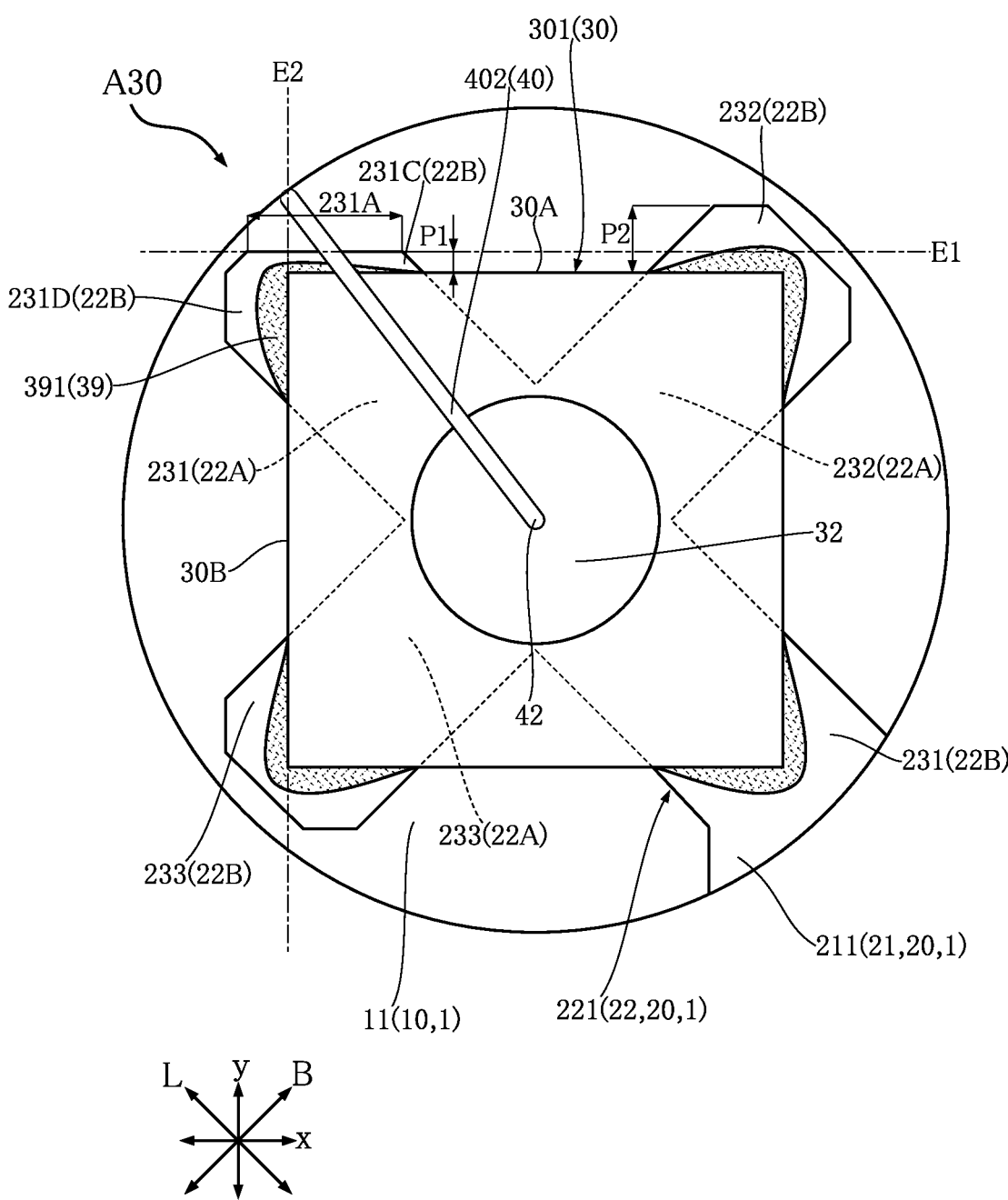
FIG. 13 is an enlarged plan view showing a part of the semiconductor device according to a third embedment of the present disclosure, where a translucent resin is not shown as being transparent.
Figure 14:
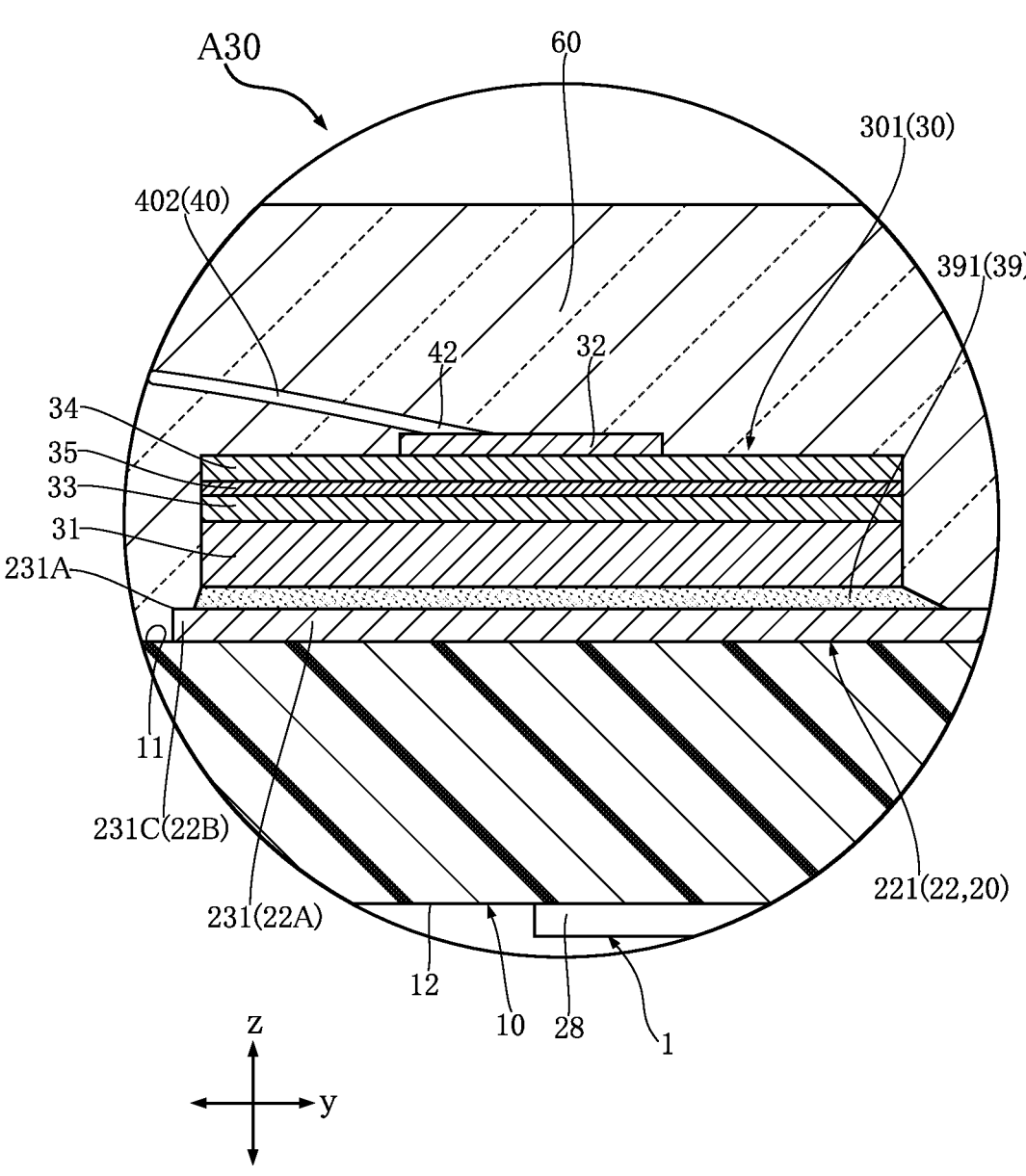
FIG. 14 is an enlarged plan view showing a part of the semiconductor device shown in FIG. 13.

Based on FIGS. 13 and 14, a semiconductor device A30 according to a third embodiment of the present disclosure is explained. In these figures, the same reference numerals are given to the elements identical to or similar with those of semiconductor device A10 that have already been explained, and the redundant explanations are omitted. In FIG. 13, the translucent resin 60 is regarded as transparent for ease of understanding. The range covered by FIG. 13 is the same as the range covered by FIG. 7. The position and the size of the section shown by FIG. 14 are the same with the position and the size of the section shown by FIG. 8.

On the semiconductor device A30, the configuration of the first die-pad 221 among the die-pads 22 is different from that of the semiconductor device A10 explained already.

As shown in FIG. 13, regarding the first die-pad 221 of the semiconductor device A30, when viewed in the thickness direction z, the pad side 231A of the first band-like part 231 is separated from the first rim 30A of the first element 301. When viewed in the thickness direction z, with respect to the first extension line E1 including the pad side 231A shown in FIG. 13, the pad side 231A is on a side to separate from the third band-like part 233. Thus, when viewed in the thickness direction z, regarding the third semiconductor device A30, the first band-like part 231 has a region extended farther than the first rim 30A of the first element 301, that is, the second region 22B (see FIGS. 13 and 14). When viewed in the thickness direction z, that region is overlapped with the second wire 402. Regarding the explanation of the semiconductor device 30, "farther than the first rim 30A" indicates more external than the first rim 30A in the direction along the second extension line E2 including the second element 302 of the semiconductor element 30 shown in FIG. 13.

As shown in FIG. 13, the first die-pad 221 of the semiconductor device A30 has a first projection 231C and a second projection 231D instead of the projection 231B, unlike the first die-pad 221 of the semiconductor device A10 explained already. The first projection 231C and the second projection 231D are the second region 22B. When viewed in the thickness direction z, the first projection 231C is overlapped with the second wire 402. The second projection 231D is connected with the first projection 231C. When viewed in the thickness direction z, the second extension line E2 including the second rim 30B of the first element 301 shown in FIG. 13 works as a border between the first projection 231C and the second projection 231D.

As shown in FIG. 13, when viewed in the thickness direction z, in the first band-like part 231, the peripheral edge of the first projection 231C and the peripheral edge of the second projection 231D respectively include a part of the pad side 231A. When viewed in the thickness direction z, the first extension line E1 including the pad side 231A shown in FIG. 13 intersects with the second band-like part 232. Thus, when seen in the thickness direction z, an amount of protrusion P1 of the first projection 231C protruding farther than the first rim 30A of the first element 301 is smaller than an amount of protrusion P2 of the second band-like part 232 protruding farther than the first rim 30A.

Subsequently, the action and effect of the semiconductor device A30 are explained.

The die-pad 22 (the first die-pad 221) of the semiconductor device A30 has the first band-like part 231, the second band-like part 232 and the third band-like part 233. Each of the first band-like part 231, the second band-like part 232 and the third band-like part 233 includes the first region 22A and the second region 22B. The second band-like part 232 is connected to one end in the width direction B of the first band-like part 231. The third band-like part 233 is connected to the other end in the width direction B of the first band-like part 231. A part of the first band like part 231 held between the second band-like part 232 and the third band-like part 233 is the first region 22A. Thus, when viewed in the thickness direction z, the die-pad 22 has a shape of letter X, and the center of the die-pad 22 is overlapped with the semiconductor element 30 (the first element 301).

In the above configuration, when viewed in the thickness direction z, the wire 40 (the second wire 402) is overlapped with the first band-like part 231. When viewed in the thickness direction z, the peripheral edge of the first band-like part 231 includes the pad side 231A intersecting with the wire 40, and the first extension line E1 including the pad side 231A (see FIG. 13) intersects with the second band-like part 232. Thus, when viewed in the thickness direction z, the length of the section of the wire 40 overlapped with the second region 22B can be made as small as possible. Therefore, even if a part of the bonding layer 39 (the first bonding layer 391) is located over the second region 22B, the volume of the part of the bonding layer 39 is relatively small, and the precipitation of the metallic particles on the wire 40 due to the ion migration from the bonding layer 39 can be prevented.

On the semiconductor device A30, the first band-like part 231 has the first projection 231C and the second projection 231D. The first projection 231C and the second projection 231D are the second region 22B. When viewed in the thickness direction z, the first projection 231C is overlapped with the wire 40. The second projection 231D is connected to the second projection 231D. When viewed in the thickness direction z, the second extension line E2 (see FIG. 13) including the second rim 30B of the semiconductor element 30 works as the border between the first projection 231C and the second projection 231D. When viewed in the thickness direction z, the area of the first projection 231C is smaller than the area of the second projection 231D. Therefore, even in the case where a part of the bonding layer 39 is over the first projection 231C and the second projection 231D, the volume of the part of the bonding layer 39 is almost entirely located over the second projection 231D. As such, the volume of the bonding layer 39 located over the first projection 231C is very little. Accordingly, the ion migration from the bonding layer 39 is more effectively prevented.

The wiring 20 according to the present disclosure is mainly composed of the plurality of metallic layers formed by electroplating. Otherwise, the wiring 20 may be the one formed from the lead frame, for example.

The present disclosure is not limited to the embodiments described above. The specific configurations of each part of the present disclosure can be subjected to various design changes.

LIST OF REFERENCE CHARACTERS

A10, A11, A12, A20, A30: Semiconductor Device
1: supporting member
10: base material
11: front surface
12: bottom surface
13: lateral surface
14: penetrating part
20: wiring
21: pad
211: first pad
212: second pad
213: third pad
214: fourth pad
22: die-pad
221: first die-pad
222: second die-pad
22A: first region
22B: second region
231: first band-like part
231A: pad side 231: projection
231C: first projection
231D: second projection
232: second band-like part
233: third band-like part
28: terminal
29: lateral surface terminal
30: semiconductor element
301: first element
302: second element
30A: first rim
30B: second rim
31: first conductive layer
32: second conductive layer
33: p-type semiconductor layer
34: n-type semiconductor layer
35: active layer
39: bonding layer
391: first bonding layer
392: second bonding layer
40: wire
401: first wire
402: second wire
41: first bonding part
42: second bonding part
50: resist layer
60: translucent resin
E1: first extension line
E2: second extension line
P1, P2: amount of protrusion
z: thickness direction
x: first direction
y: second direction
B: width direction

The invention claimed is:

1. A semiconductor device, comprising:
a supporting member having a wiring including a die-pad;
a semiconductor element bonded to the die-pad;
a wire bonded to the wiring and the semiconductor element; and
a bonding layer that has a conductivity and bonds the die-pad and the semiconductor element,
wherein when viewed in a thickness direction of the semiconductor element, the die-pad includes a first region included inside a peripheral edge of the semiconductor element and a second region that is connected to the first region and extends farther than the peripheral edge of the semiconductor element,
wherein when viewed in the thickness direction, the wire is separated from the second region,
wherein the die-pad has a first band-like part, a second band-like part, and a third band-like part,
wherein the second band-like part is connected to a first end of the first band-like part,
wherein the third band-like part is connected to a second end of the first band-like part,
wherein when viewed in the thickness direction, the wire is overlapped with the first band-like part,
wherein when viewed in the thickness direction, a peripheral edge of the first band- like part includes a pad side intersecting with the wire, and a first extension line including the pad side intersects with the second band-like part,
wherein the first band-like part has a projection that is the second region located closest from the wire, and wherein when viewed in the thickness direction, a peripheral edge of the projection includes a part of the pad side.

2. The semiconductor device according to claim 1, wherein the bonding layer includes a part located over the second region.

3. The semiconductor device according to claim 1, wherein the bonding layer is made of a material including metallic particles and a synthetic resin.

4. The semiconductor device according to claim 3, wherein the metallic particles are silver.

5. The semiconductor device according to claim 3, wherein the die-pad has the first band-like part extending in a direction orthogonal to the thickness direction, and the second band-like part and the third band-like part extending in a width direction of the first band-like part, the first band-like part having the first end and the second end separated from each other in the width direction,
wherein each of the first band-like part, the second band-like part and the third band-like part includes the first region and the second region, and
wherein a part of the first band-like part held between the second band-like part and the third band-like part is the first region.

6. The semiconductor device according to claim 5, wherein when viewed in the thickness direction, the semiconductor element is a rectangle having four corners, and
wherein when viewed in the thickness direction, each of the four corners is overlapped with one of the first band-like part, the second band-like part and the third band-like part.

7. The semiconductor device according to claim 1, wherein when viewed in the thickness direction, a peripheral edge of the semiconductor element includes a first rim intersecting with the wire and a second rim that is connected to the first rim and is located closest from the wire, and
wherein when viewed in the thickness direction, the projection is located on a side to separate from the second band-like part with respect to a second extension line including the second rim.

8. The semiconductor device according to claim 7, wherein the pad side is parallel to the first rim.

9. The semiconductor device according to claim 3, wherein the semiconductor element has a first conductive layer opposed to the first region, and the second conductive layer positioned on an opposite side from the first conductive layer in the thickness direction,
wherein the first conductive layer is bonded to the die-pad via the bonding layer, and
wherein the wire is bonded to the second conductive layer.

10. The semiconductor device according to claim 9, wherein the first conductive layer is made of a material including a semiconductor.

11. The semiconductor device according to claim 9, wherein the semiconductor element is an LED.

12. The semiconductor device according to claim 11, further comprising a translucent resin in contact with the supporting member,
wherein the translucent resin covers the semiconductor element and the wire.

13. The semiconductor device according to claim 12, wherein the supporting member has a base material having a front surface facing in the thickness direction, and wherein the wiring is arranged on the front surface, and the translucent resin is in contact with the front surface.

14. The semiconductor device according to claim 13, wherein the base material has a bottom surface facing oppositely from the front surface in the thickness direction, and a lateral surface that is connected to the front surface and the bottom surface and faces in a direction orthogonal to the thickness direction outwardly, and a plurality of penetrating parts recessed from the lateral surface toward inside of the base material and connected to the front surface and the bottom surface, wherein the supporting member has a plurality of terminals arranged on the bottom surface, and a plurality of lateral surface terminals individually arranged on the plurality of penetrating parts, and wherein each of the plurality of lateral surface terminals is conducted to the wiring, and is connected to one of the plurality of terminals.

15. The semiconductor device according to claim 14, further comprising a resist layer that is arranged on the front surface, and has electric insulating property, wherein the resist layer blocks one end in the thickness direction of each of the plurality of penetrating parts.

16. The semiconductor device according to claim 15, wherein at least a part of the resist layer is located between the supporting member and the translucent resin.

* * * * *